(12) United States Patent
Miller et al.

(10) Patent No.: US 11,962,270 B2
(45) Date of Patent: Apr. 16, 2024

(54) LOW PROFILE SOLAR PANEL AND METHOD OF MANUFACTURE

(71) Applicant: ZampTech Sub LLC, Bend, OR (US)

(72) Inventors: Conor Miller, Bend, OR (US); Brian Butcher, Bend, OR (US)

(73) Assignee: ZampTech Sub LLC, Bend, OR (US)

( * ) Notice: Subject to any disclaimer, the term of this patent is extended or adjusted under 35 U.S.C. 154(b) by 4 days.

(21) Appl. No.: 17/025,632

(22) Filed: Sep. 18, 2020

(65) Prior Publication Data

US 2021/0091715 A1 Mar. 25, 2021

Related U.S. Application Data

(60) Provisional application No. 62/903,221, filed on Sep. 20, 2019.

(51) Int. Cl.
| | |
|---|---|
| *H02S 30/10* | (2014.01) |
| *F24S 25/63* | (2018.01) |
| *H01L 31/0216* | (2014.01) |
| *H01L 31/042* | (2014.01) |
| *F24S 25/00* | (2018.01) |

(52) U.S. Cl.
CPC .............. *H02S 30/10* (2014.12); *F24S 25/63* (2018.05); *H01L 31/02168* (2013.01); *H01L 31/042* (2013.01); *F24S 2025/011* (2018.05)

(58) Field of Classification Search
CPC .................................. H02S 30/10; H01L 31/42
See application file for complete search history.

(56) References Cited

U.S. PATENT DOCUMENTS

| | | | |
|---|---|---|---|
| 4,239,555 A | * | 12/1980 | Scharlack ......... B32B 17/10302 |
| | | | 156/286 |
| 2012/0097219 A1 | | 4/2012 | Takagi et al. |
| 2012/0298817 A1 | | 11/2012 | West et al. |
| 2016/0134231 A1 | | 5/2016 | Wu et al. |
| 2016/0285414 A1 | * | 9/2016 | Asbeck ................... H02S 20/00 |

FOREIGN PATENT DOCUMENTS

| | | | | |
|---|---|---|---|---|
| CN | 202796983 U | | 3/2013 | |
| JP | H08181347 A | * | 7/1996 | ........... H01L 31/042 |
| WO | WO 2011065543 | * | 6/2011 | .............. F24S 40/44 |

(Continued)

OTHER PUBLICATIONS

English machine translation of Motoyama (WO 2011065543), published Jun. 6, 2011.*

(Continued)

*Primary Examiner* — Christina Chern
(74) *Attorney, Agent, or Firm* — PATTERSON + SHERIDAN, LLP (57) ABSTRACT

A solar panel assembly includes a substrate and a solar array coupled to the substrate. The solar array includes a plurality of photovoltaic cells. An optical layer is disposed over the solar array. The optical layer, the solar array, and the substrate together form a solar assembly. A frame surrounds the solar assembly and includes a plurality of frame members. Each frame member of the plurality of frame members includes an arcuate member that forms an aerodynamic outer edge of the frame member.

9 Claims, 8 Drawing Sheets

(56) References Cited

FOREIGN PATENT DOCUMENTS

WO    WO-2012096298 A1 *  7/2012  ............. F24J 2/5207
WO    WO 2016157692     * 10/2016  ............. H02S 30/10

OTHER PUBLICATIONS

English machine translation of Kubo et al. (WO 2016157692), published Oct. 6, 2016.*
English machine translation of Nakajima et al. (WO 2012/096298) published Jul. 19, 2012.*
English translation of Nawa et al. (JP H 08-181347) published Jul. 1996.*
Thomas, Shane, "International Search Report" for PCT/US2020/051525, dated Feb. 12, 2021, 13 pages.

* cited by examiner

LOW PROFILE SOLAR PANEL AND METHOD OF MANUFACTURE

CROSS-REFERENCE TO RELATED APPLICATIONS

This patent application claims priority from U.S. Provisional Patent Application No. 62/903,221, filed on Sep. 20, 2019. U.S. Provisional Patent Application No. 62/903,221 is hereby incorporated by reference.

BACKGROUND

Technical Field

The present disclosure relates generally to off-grid power generation and more particularly, but not by way of limitation, to solar panels having a low-profile construction for use with motorized vehicles.

History of Related Art

This section provides background information to facilitate a better understanding of the various aspects of the disclosure. It should be understood that the statements in this section of this document are to be read in this light, and not as admissions of prior art.

Off-grid electrification refers to systems that provide electrical power to individuals without the support of a remote electric infrastructure. In many cases, an off-grid electrical system is a stand-alone power system that generates electricity through various means, such as solar and wind power that is stored and used locally. Off-grid electrical systems, such as solar panels find particular utility in activities requiring mobility such as camping and remote living as well as in conjunction with vehicles such as military and emergency response vehicles, buses, trucking, public transportation, heavy equipment, towable machinery, marine vehicles and recreational vehicles ("RVs"). One aspect that must be considered in the installation of solar panels in mobile applications is that air flow across the panel as well as dynamic pressures resulting from air resistance of the panel. Additionally, many mobile applications have size, mounting structure, and aesthetic constraints that must be considered in design of the system.

SUMMARY

Various aspects of the disclosure relate to a solar panel assembly. The solar panel assembly includes a substrate and a solar array coupled to the substrate. The solar array includes a plurality of photovoltaic cells. An optical layer is disposed over the solar array. The optical layer, the solar array, and the substrate together form a solar assembly. A frame surrounds the solar assembly and includes a plurality of frame members. Each frame member of the plurality of frame members includes an arcuate member that forms an aerodynamic outer edge of the frame member.

Various aspects of the disclosure relate to a mounting assembly for a solar panel. The mounting assembly includes a frame member having a channel formed therein. A T-nut is received into and slidably disposed within the channel. A spacer is coupled to the T-nut. A mounting foot is coupled to the spacer. The mounting foot includes a flange, a spacer tab extending from the flange, and a tab extending vertically from the spacer tab. The tab engaging the channel.

Various aspects of the disclosure relate to a method of manufacturing solar panel. The method includes arranging a plurality of photovoltaic cells on a substrate. An optical layer is disposed over the photovoltaic cells. The substrate, the solar array, and the optical layer are laminated to form a solar assembly. A plurality of frame members are secured to the solar assembly. The plurality of frame members include an arcuate member that forms an aerodynamic outer edge.

This summary is provided to introduce a selection of concepts that are further described below in the detailed description. This summary is not intended to identify key or essential features of the claimed subject matter, nor is it intended to be used as an aid in limiting the scope of claimed subject matter.

BRIEF DESCRIPTION OF THE DRAWINGS

The disclosure is best understood from the following detailed description when read with the accompanying figures. It is emphasized that, in accordance with standard practice in the industry, various features are not drawn to scale. In fact, the dimensions of various features may be arbitrarily increased or reduced for clarity of discussion.

DETAILED DESCRIPTION

Various embodiments will now be described more fully with reference to the accompanying drawings. The disclosure may, however, be embodied in many different forms and should not be construed as limited to the embodiments set forth herein.

Off-grid electrical systems, and particularly off-grid solar systems, find particular utility in connection with vehicles such as, for example, military and emergency response vehicles, buses, trucking, public transportation, heavy equipment, towable machinery, marine vehicles, and RVs. In such applications, a solar panel or an array of solar panels is secured, for example, to a roof of the vehicle in such a way as to be exposed to solar energy. It is beneficial for the solar panels to have an aerodynamic profile in order to reduce wind resistance against the solar panels during periods when the vehicle is in motion. Such an arrangement as well as the placement, size, and profile, can reduce the potential for damage to the solar panels and may improve a fuel efficiency of the vehicle.

Figure 1A:
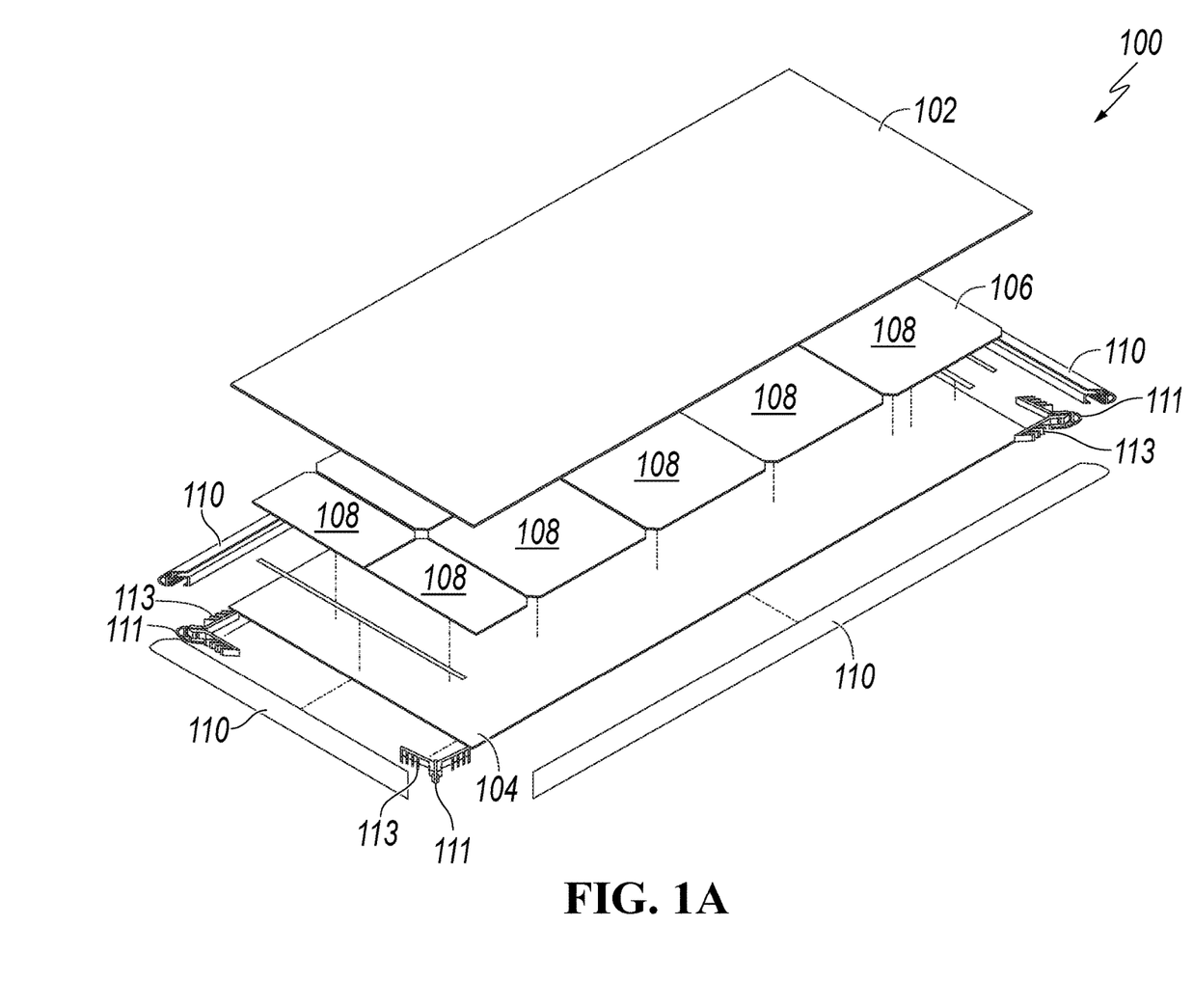
FIG. 1A is an exploded top perspective view of a solar panel assembly according to aspects of the disclosure.
Figure 1B:
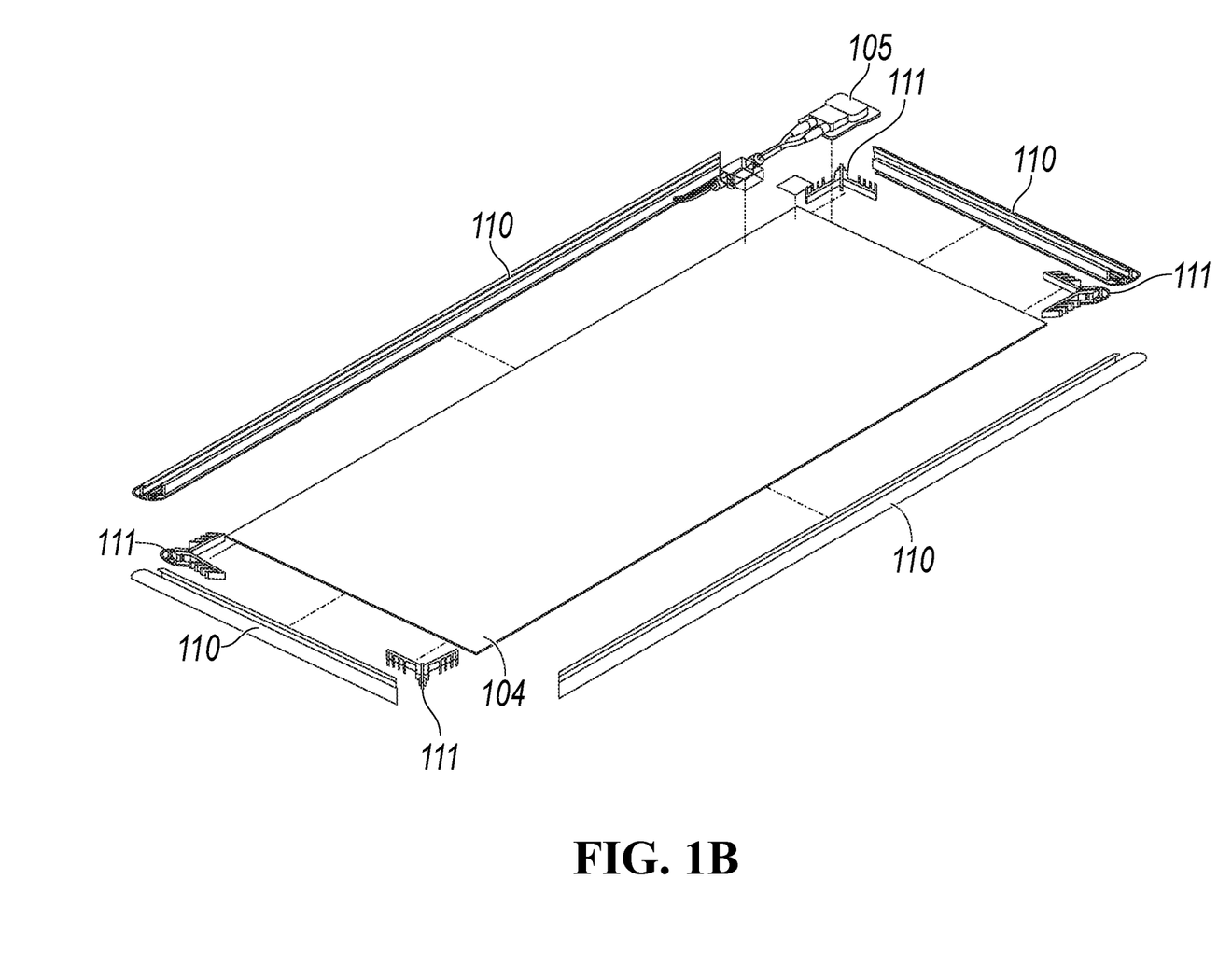
FIG. 1B is an exploded bottom perspective view of the solar panel assembly of FIG. 1A.

FIG. 1A is an exploded top perspective view of a solar panel assembly 100. FIG. 1B is an exploded bottom perspective view of a solar panel assembly 100. Referring to FIGS. 1A and 1B collectively, the solar panel assembly 100 includes an optical layer 102 and a substrate 104. A solar array 106 is disposed between the optical layer 102 and the substrate 104. The solar array 106 includes photovoltaic cells 108 that are arranged on the substrate 104. The solar array 106, the optical layer 102, and the substrate 104 are bounded, or surrounded, by frame members 110. In various embodiments the frame members 110 are coupled to each other at approximate right angles via corner members 111. In various embodiments, the corner members 111 include ribs 113 that are received into the frame members 110 and produce a friction fit between the corner members 111 and the frame members 110. In various embodiments, the optical layer 102 is constructed of a substantially transparent material such as, for example, low-iron tempered float glass. In other embodiments, the optical layer 102 may be constructed of an impact-resistant material such as, for example, polycarbonate. The optical layer 102 is substantially transparent so as to facilitate transmission of solar energy to the solar array underlying the optical layer and may, in some embodiments, be coated or embedded with an anti-reflective material. In various embodiments, the optical layer 102 has a minimum thickness of, for example, approximately 1 mm and a maximum thickness of, for example, approximately 4 mm.

The solar array 106 includes at least one photovoltaic cell 108. In various embodiments, the solar array 106 may include a plurality of photovoltaic cells 108. In various embodiments, the photovoltaic cells 108 may be, for example, silicon solar cells, monocrystalline silicon solar cells, polycrystalline solar cells, thin-film solar cells, amorphous silicon solar cells, cadmium solar cells, copper indium gallium selenide solar cells, or any other type of photovoltaic cells that operate on the photovoltaic effect. During operation, the solar array 106 receives the solar energy through the optical layer 102 and converts the solar energy into an electrical current. The electrical current is transmitted to a power transformer 105 which is disposed on a rear face of the substrate 104 and electrically coupled to the solar array 106. The solar array 106 is coupled to the substrate 104 via, for example, a thermosetting polymer such as, for example, epoxy resins, phenolic resins, unsaturated polyester resins, polyurethane resins, silicones, vinyl esters, or any other type of thermosetting polymer adhesive. In various embodiments, the substrate 104 is a flexible, high-temperature polymer such as, for example, ethylene-vinyl acetate ("EVA") or polyolefin elastomer ("POE").

Figure 2:
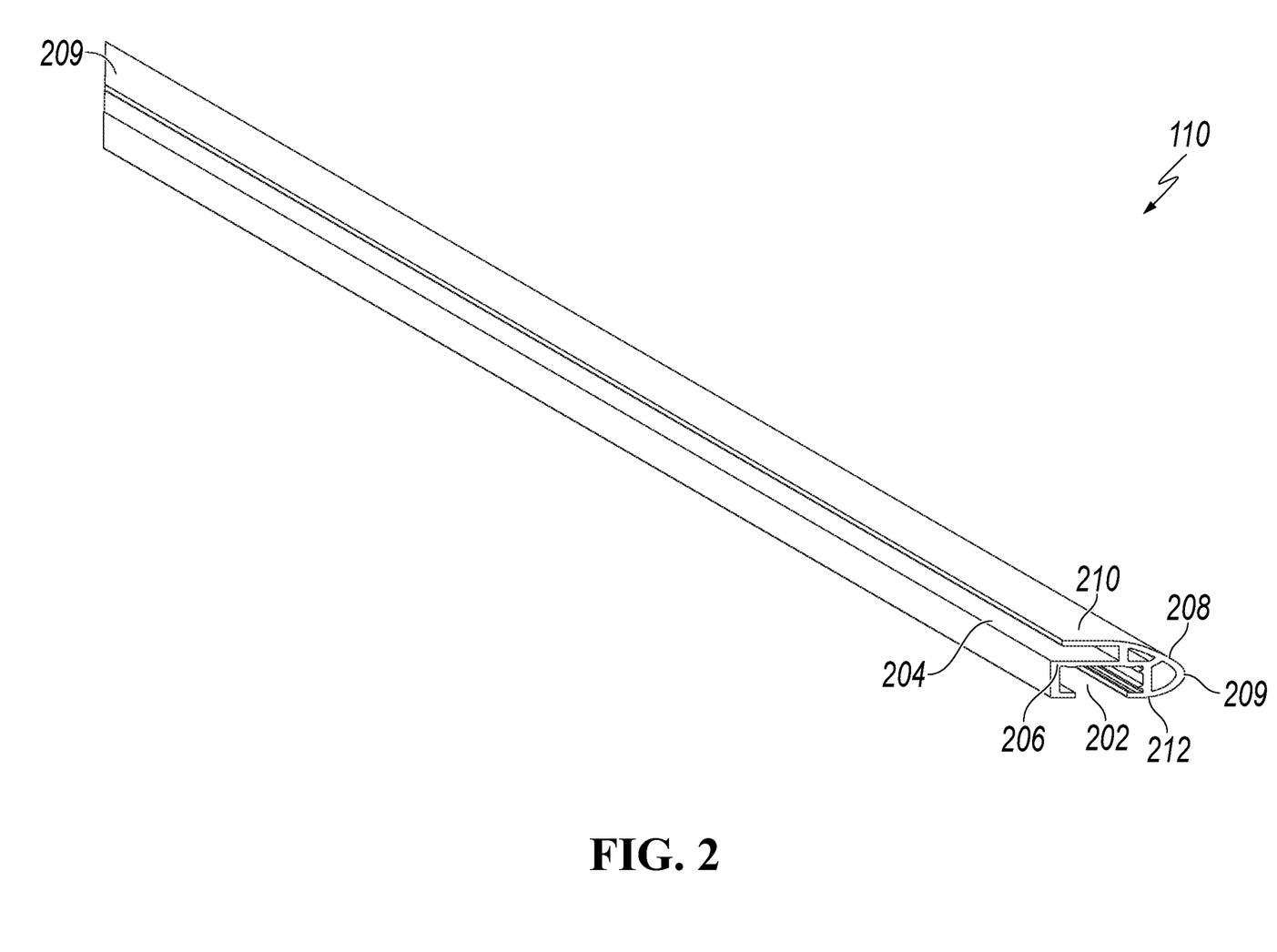
FIG. 2 is a perspective view of a support rail for use with the solar panel assembly according to aspects of the disclosure.
Figure 3:
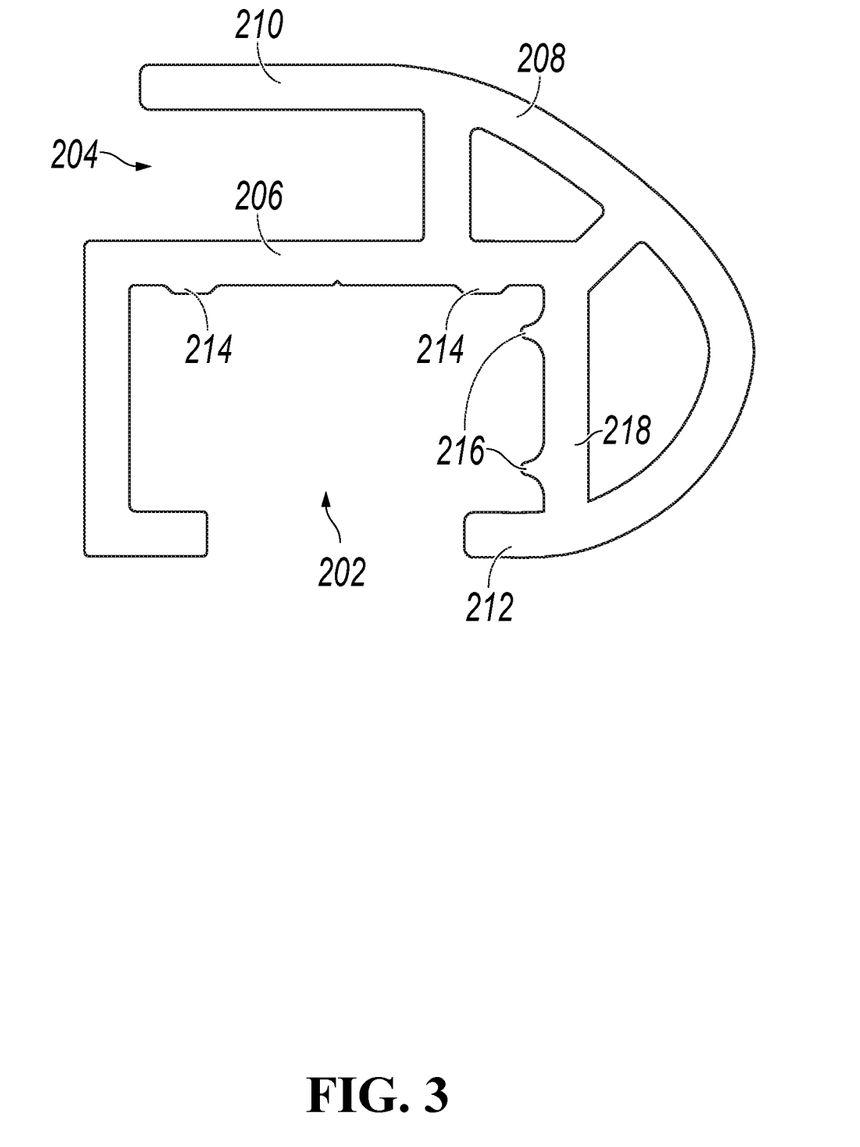
FIG. 3 is an end view of the support rail of FIG. 2.

FIG. 2 is a perspective view of a frame member 110 for use with the solar panel assembly 100. FIG. 3 is an end view of the frame member. The frame member 110 includes a channel 202 formed therein. Vertical ridges 214 are formed from an upper member 206 of the channel 202 towards an interior of the channel 202. Horizontal ridges 216 are formed on a side member 218 of the channel 202 and extend towards an interior of the channel 202. A notch 204 is formed on an upper member 206 of the channel 202. An arcuate member 208 couples a top surface 210 of the notch 204 with a lower aspect 212 of the channel 202. In various embodiments, the arcuate member 208 forms a curved and aerodynamic outer edge of the frame member 110, which, for example, reduces wind resistance and facilitates placement of the solar panel assembly 100 on an exterior of, for example, a motor vehicle. Wind resistance can not only reduce the fuel efficiency of the vehicle but also impart dynamic pressures and stresses to the solar panel assembly 100 and particularly to the frame members 110.

The arcuate member 208 includes a curved, a generally curved, or a substantially curved section of the cross section of the frame member 110. Additionally, the arcuate member 208 may, in various embodiments, include any angle or combination of angles to form a suitable radius and cross-sectional shape. By way of example, in the embodiment illustrated in FIGS. 2-3, the arcuate member 208 curves away from an interior of the solar panel assembly 100. In other embodiments, the arcuate member 208 may be, for example, concave or convex relative to the center of the solar panel assembly 100. In various embodiments, the arcuate member 208 may include any combination of radii such as, for example, approximately 0.1 inches to approximately 1.5 inches.

Still referring to FIGS. 2-3, when assembled, the optical layer 102, the substrate 104, and the solar array 106 are received into the notch 204. In various embodiments, an interference fit is created between a laminated assembly of the substrate 104, the solar array 106, and the optical layer 102 and the notch such that the laminated assembly of the substrate 104, the solar array 106, and the optical layer 102 is retained in the notch 204 via friction. In various embodiments, the frame member 110 has a height of, for example, 0.75 inches; however, in other embodiments, heights of greater than or less than 0.75 inches may be utilized. The frame members 110 are formed with mitered ends 209 so as to facilitate placement of the frame members 110 around the assembly of the optical layer 102, the substrate 104, and the solar array 106 in a manner that creates smooth aerodynamic corners.

Figure 4:
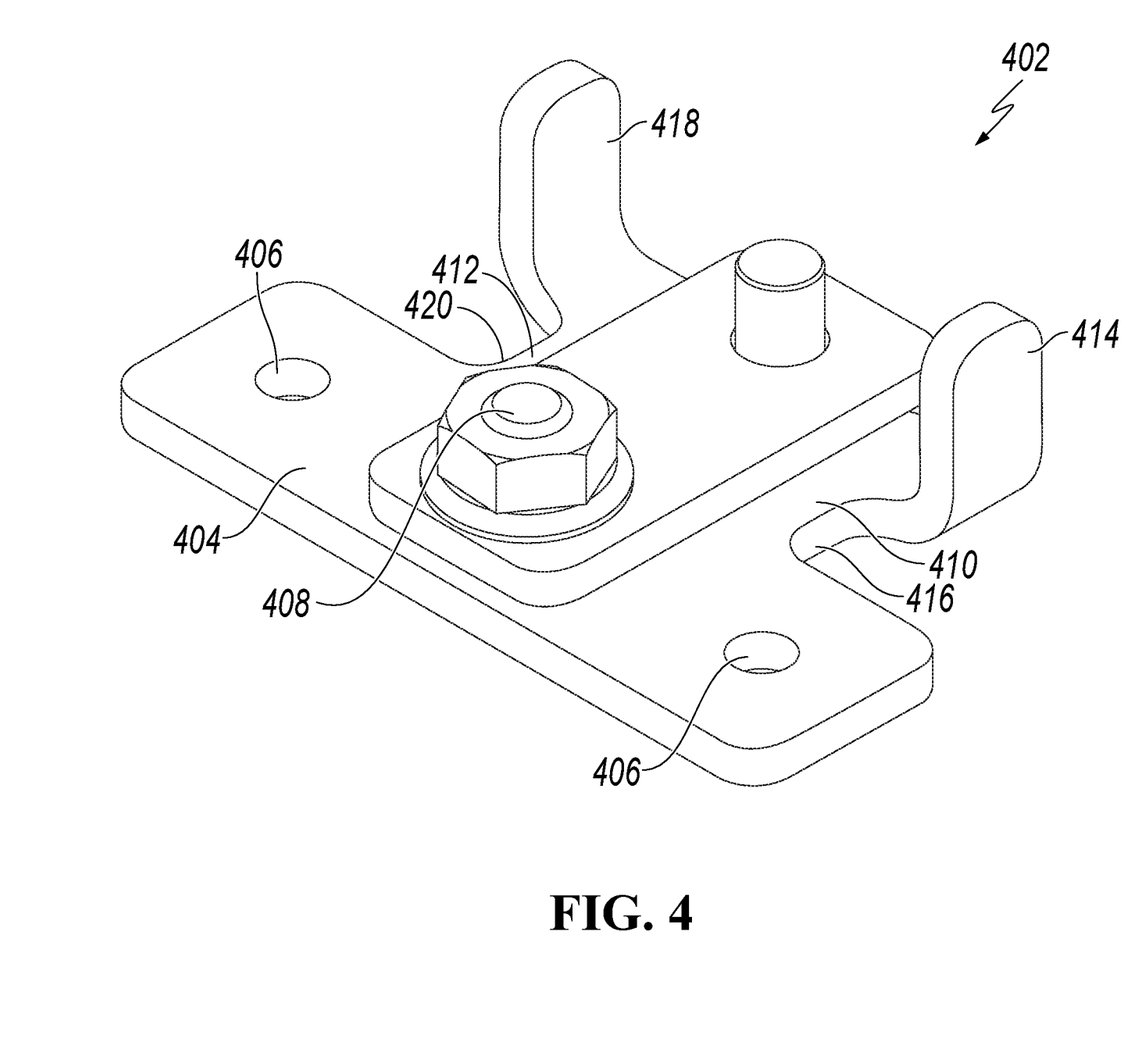
FIG. 4 is a perspective view of a mounting foot for use with the solar panel assembly according to aspects of the disclosure.

FIG. 4 is a perspective view of a mounting foot 402 for use with the exemplary solar panel assembly 100. The mounting foot 402 includes a flange 404 having apertures 406 formed therein. By way of example, the mounting foot 402 is illustrated in FIG. 4 as including two apertures 406 formed through the flange 404; however, in other embodiments, any number of apertures 406 could be formed through the flange 404. A threaded fastening member 408 extends from the flange 404 in a direction generally perpendicular to a plane of the flange 404. In the embodiment illustrated in FIG. 4, the fastening member 408 is, for example, a captive bolt; however, in other embodiments, the fastening member may be, for example, a non-captive screw or bolt. A first spacer tab 410 and a second spacer tab 412 extend from the flange 404 and are generally planar with the flange 404. A first tab 414 extends upwardly from an outer edge 416 of the first spacer tab 410. Likewise, a second tab 418 extends upwardly from an outer edge 420 of the second spacer tab 412.

Figure 5A:
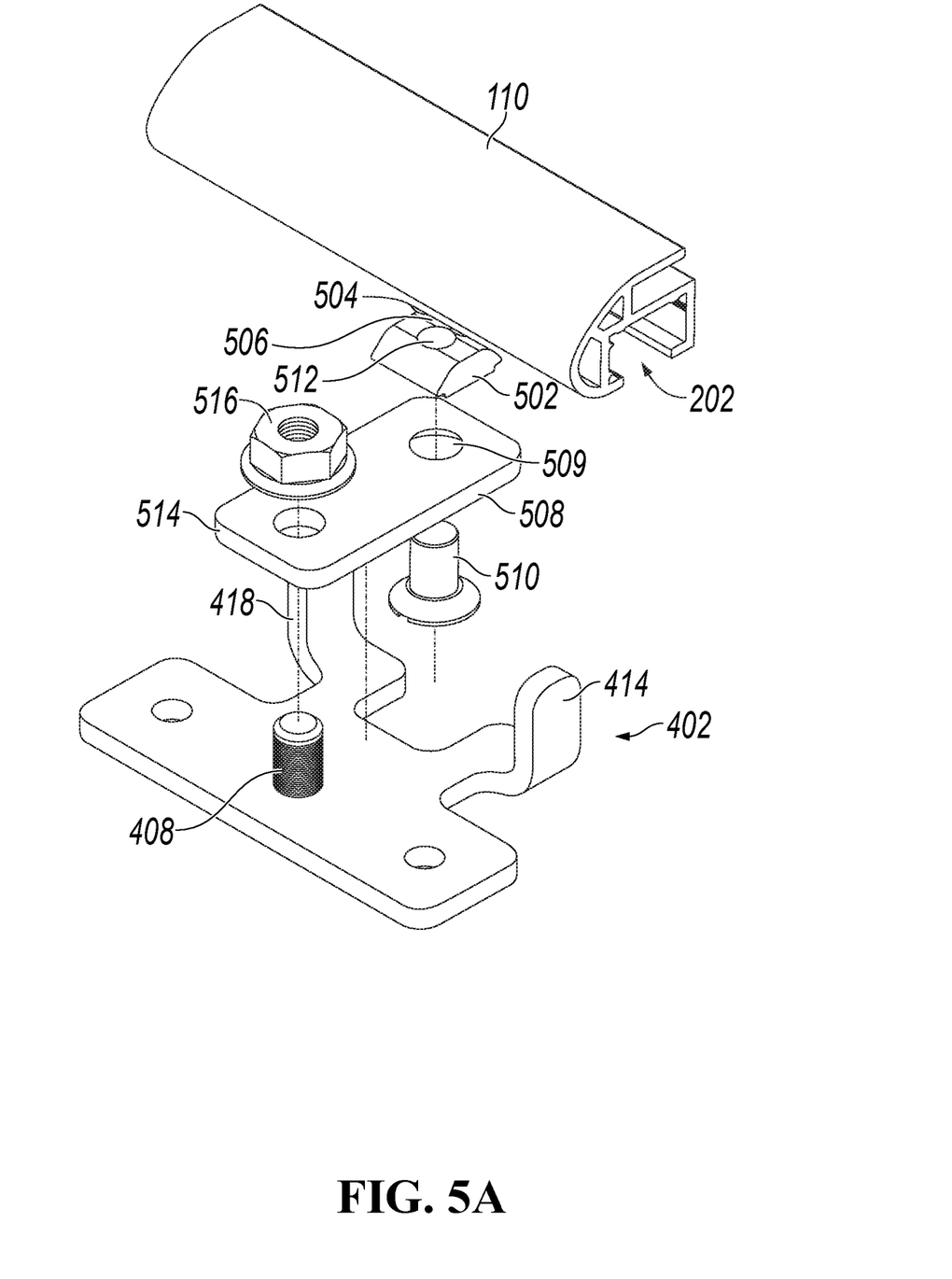
FIG. 5A is an exploded perspective view of the support rail and the mounting foot according to aspects of the disclosure.
Figure 5B:
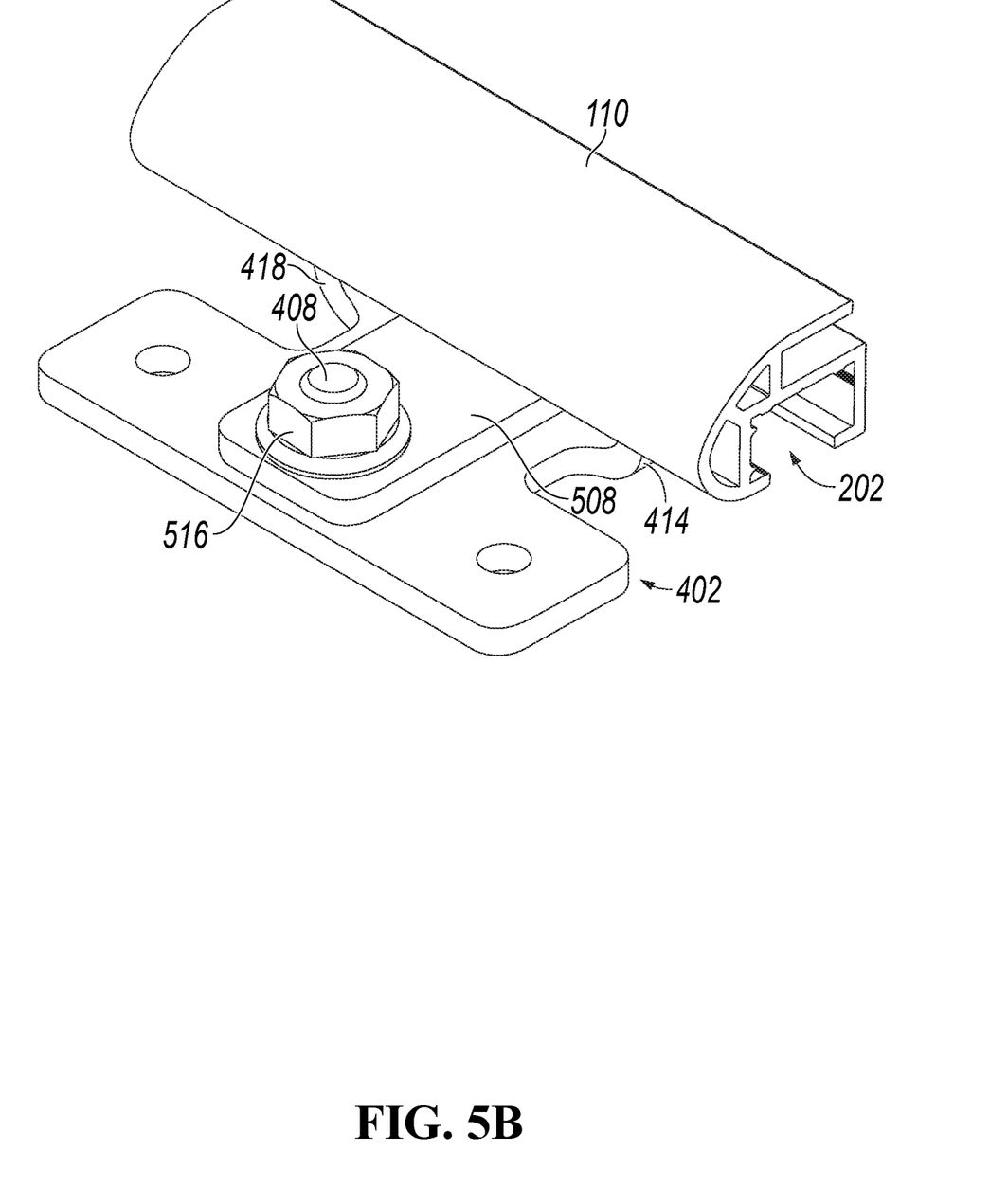
FIG. 5B is an assembled perspective view of the support rail and the mounting foot according to aspects of the disclosure.

FIG. 5A is an exploded perspective view of the frame member 110 and the mounting foot 402. FIG. 5B is an assembled perspective view of the frame member 110 and the mounting foot 402. Referring to FIGS. 5A and 5B collectively, a T-nut 502 is received into the channel 202 of the frame member 110. The T-nut 502 includes a spring member 504 that extends upwardly from a top surface 506 of the T-nut 502. When assembled, the spring member 504 engages the interior of the channel 202 and increases friction between the T-nut 502 and the channel 202, thereby reducing the likelihood of inadvertent movement of the T-neat 502 within the channel 202. A spacer 508 is coupled to the T-nut 502 via a fastener 510 that is received through a first aperture 509 formed in the spacer 508. In various embodiments, the fastener 510 is a threaded fastener such as, for example, a screw or bolt that engages a threaded aperture 512 formed in the T-nut 502. However, in other embodiments, the fastener 510 may be a non-threaded fastener such as, for example, a rivet, a friction pin, or other fastener that secures the spacer 508 to the T-nut 502. When assembled, the spacer 508 is flush against a bottom aspect of the channel 202 and extends laterally from the frame member 110.

Still referring to FIG. 5, the fastening member 408 of the mounting foot 402 is received through a second aperture 514 formed in the spacer 508 and is secured thereto with a nut 516. The first tab 414 and the second tab 418 are received into the channel 202 thereby preventing rotation of the mounting foot 402 relative to the spacer 508 or the frame member 110. When assembled, the mounting foot 402 is flush with a bottom surface 517 of the spacer 508 and the flange 404 extends laterally from the frame member 110 thereby facilitating attachment of the solar panel assembly 100 to, for example, a vehicle.

Figure 6:
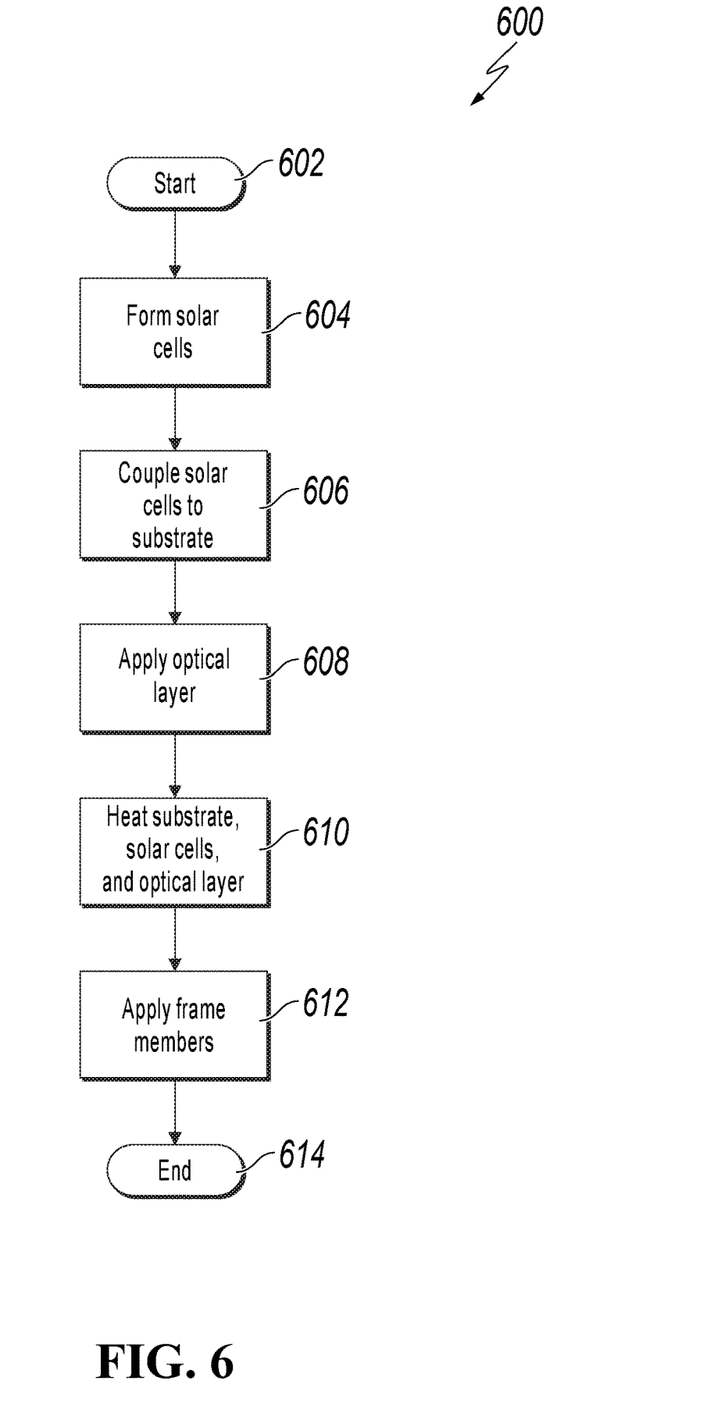
FIG. 6 is a flow diagram illustrating a process for manufacturing the solar panel assembly according to aspects of the disclosure.

FIG. 6 is a flow diagram illustrating a process 600 for manufacturing the solar panel assembly 100. The process 600 begins at step 602. At step 604, raw solar cells are cut to form the photovoltaic cells 108. At step 606, the photovoltaic cells 108 are coupled to the substrate 104 via, for example, a thermosetting polymer. At step 608, the optical layer 102 is applied above the photovoltaic cells 108. At step 610, the substrate 104, the photovoltaic cells 108, and the optical layer 102 are heated in order to cure the thermosetting polymer. At step 612, the frame members 110 are applied to the substrate 104, the photovoltaic cells 108, and the optical layer 102. The process 600 ends at step 614.

The term "substantially" is defined as largely but not necessarily wholly what is specified (and includes what is specified; e.g., substantially 90 degrees includes 90 degrees and substantially parallel includes parallel), as understood by a person of ordinary skill in the art. In any disclosed embodiment, the terms "substantially," "approximately," "generally," and "about" may be substituted with "within a percentage of" what is specified.

Depending on the embodiment, certain acts, events, or functions of any of the algorithms described herein can be performed in a different sequence, can be added, merged, or left out altogether (e.g., not all described acts or events are necessary for the practice of the algorithms). Moreover, in certain embodiments, acts or events can be performed concurrently, e.g., through multi-threaded processing, interrupt processing, or multiple processors or processor cores or on other parallel architectures, rather than sequentially. Although certain computer-implemented tasks are described as being performed by a particular en other embodiments are possible in which these tasks are performed by a different entity.

Conditional language used herein, as., among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While the above detailed description has shown, described, and pointed out novel features as applied to various embodiments, it will be understood that various omissions, substitutions, and changes in the form and details of the devices or algorithms illustrated can be made without departing from the spirit of the disclosure. As will be recognized, the processes described herein can be embodied within a form that does not provide all of the features and benefits set forth herein, as some features can be used or practiced separately from others. The scope of protection is defined by the appended claims rather than by the foregoing description. All changes which come within the meaning and range of equivalency of the claims are to be embraced within their scope.

What is claimed is:

1. A solar panel assembly, comprising:
   a substrate;
   a solar array coupled to the substrate, the solar array comprising a plurality of photovoltaic cells;
   an optical layer disposed over the solar array, wherein the optical layer, the solar array, and the substrate together form a solar assembly; and
   a frame surrounding the solar assembly, the frame comprising a plurality of frame members, each frame member of the plurality of frame members comprising:
      an arcuate member that extends from at least a first surface of the frame member above the solar assembly to a second surface of the frame member below the solar assembly and forms an aerodynamic outer edge of the frame member;
      a notch into which the solar assembly is received, the first surface comprising a top surface of the notch; and
      a channel formed therein, the second surface comprising a lower aspect of the channel.

2. The solar panel assembly of claim 1, wherein the optical layer has a maximum thickness of approximately 4mm.

3. The solar panel assembly of claim 1, wherein the optical layer comprises at least one of glass and polycarbonate.

4. The solar panel assembly of claim 1, wherein each frame member of the plurality of frame members is secured to the solar assembly via friction between the substrate, the optical layer, and the frame member.

5. The solar panel assembly of claim 1, wherein each frame member of the plurality of frame members comprises:
   a vertical ridge formed from an upper member of the channel, the vertical ridge extending towards an interior of the channel; and
   a horizontal ridge formed on a side member of the channel, the horizontal ridge extending towards the interior of the channel.

6. The solar panel assembly of claim 5, wherein, for each frame member of the plurality of frame members, the notch is formed on the upper member of the channel, and wherein the arcuate member couples the top surface of the notch with the lower aspect of the channel.

7. The solar panel assembly of claim 6, wherein the arcuate member curves away from an interior of the solar panel assembly.

8. The solar panel assembly of claim 6, wherein the solar assembly is retained in the notch via friction.

9. A method of manufacturing a solar panel, the method comprising:
   arranging a solar array comprising a plurality of photovoltaic cells on a substrate;
   disposing an optical layer over the plurality of photovoltaic cells;
   laminating the substrate, the solar array, and the optical layer to form a solar assembly; and securing a plurality of frame members to the solar assembly, each frame member of the plurality of frame members comprising:
- an arcuate member that extends from at least a first surface of the frame member above the solar assembly to a second surface of the frame member below the solar assembly and forms an aerodynamic outer edge;
- a notch into which the solar assembly is received, the first surface comprising a top surface of the notch; and
- a channel formed therein, the second surface comprising a lower aspect of the channel.

* * * * *